US006867614B1

(12) United States Patent
Le Graverand et al.

(10) Patent No.: US 6,867,614 B1
(45) Date of Patent: Mar. 15, 2005

(54) MULTICONFIGURATION MODULE FOR HARDWARE PLATFORMS

(75) Inventors: Philippe Y. Le Graverand, Saint Lys (FR); Agnes C. Hermeline, Saubens (FR)

(73) Assignee: Storage Technology Corporation, Louisville, CO (US)

( * ) Notice: Subject to any disclaimer, the term of this patent is extended or adjusted under 35 U.S.C. 154(b) by 0 days.

(21) Appl. No.: 10/445,626

(22) Filed: May 27, 2003

(Under 37 CFR 1.47)

(51) Int. Cl.⁷ .................................................. G06F 7/38
(52) U.S. Cl. .............................. 326/38; 326/40; 326/39
(58) Field of Search .............................. 326/37–39, 40, 326/41, 46, 47

(56) References Cited

U.S. PATENT DOCUMENTS

2003/0009242 A1 * 1/2003 Bocchi ......................... 700/61
2004/0068330 A1 * 4/2004 White .......................... 700/18

* cited by examiner

Primary Examiner—Anh Q. Tran
(74) Attorney, Agent, or Firm—Brooks Kushman P.C.

(57) ABSTRACT

A multiconfiguration module (MCM) includes a field-programmable gate array (FPGA), a memory flash, and a complex programmable logic device (CPLD). Hardware interfaces between the concerned components and the use of a raw FPGA configuration data stream (representing a part of FPGA code which should be common to all streams) are discussed. The raw configuration data stream handles communications between a user application running on the host system and the hardware platform components. The user application has the capability to load a new configuration data stream into the memory flash and request a full or partial reconfiguration of the FPGA with the available configuration data stream. This results in an FPGA that is re-programmable on-demand and that is useable in a variety of hardware platforms such as, for example, RAIT.

10 Claims, 1 Drawing Sheet

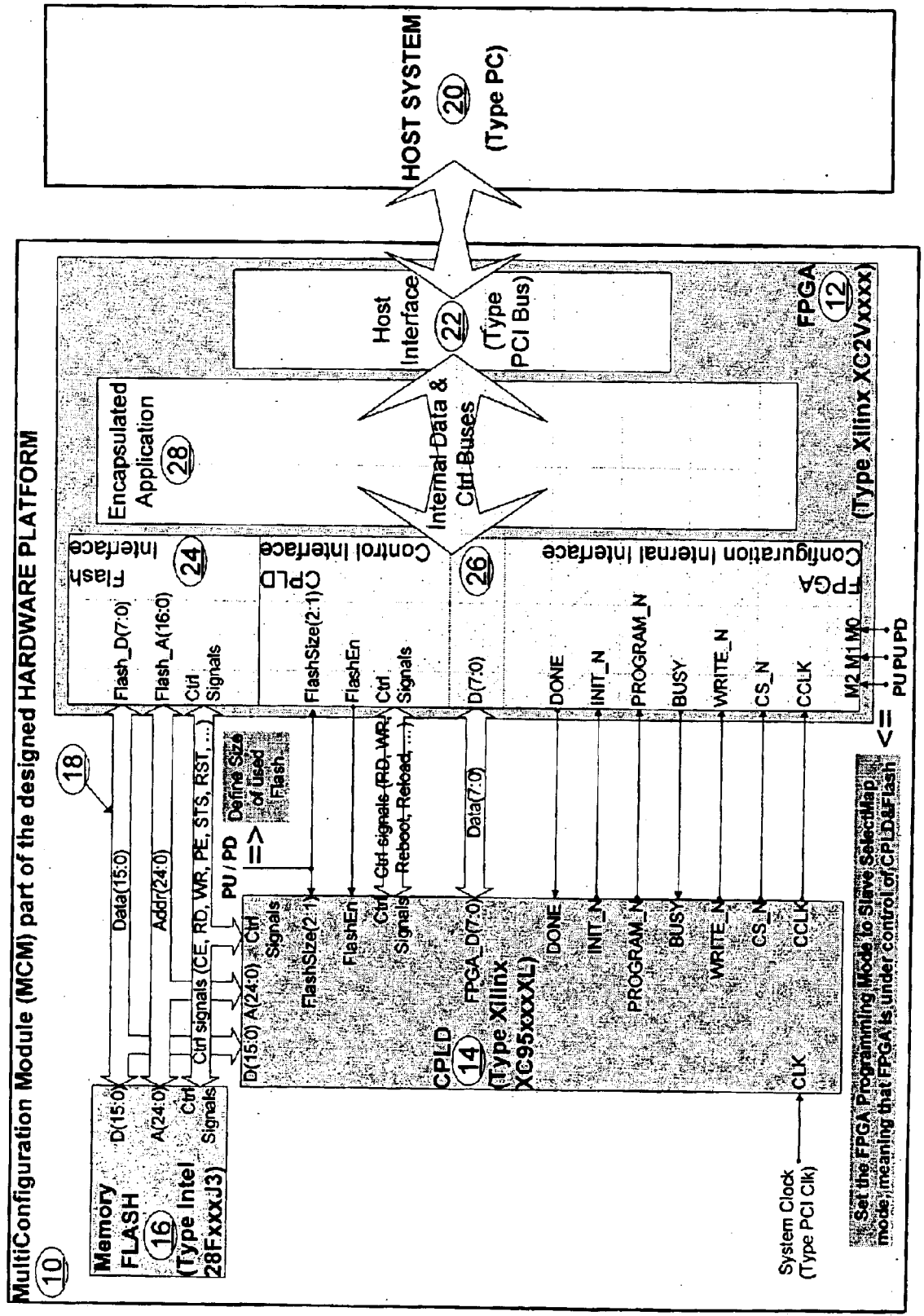

MULTICONFIGURATION MODULE FOR HARDWARE PLATFORMS

BACKGROUND OF THE INVENTION

1. Field of the Invention

The present invention relates to field-programmable gate arrays (FPGAs) and to ways of programming them.

2. Background Art

Technological improvements in speed and density by featuring sub-nanosecond gate delays and multi-million gate capacities have propelled Field-Programmable Gate Arrays (FPGAs) to the forefront of modern design practice, and FPGAs are now the cornerstone of many hardware designs. FPGAs are customized by loading configuration data into their internal memory cells. Most of FPGA can be programmed an unlimited number of times and support system clock rates of up to 50 MHz (configuration of a one-million gates part could be done in less than 15 ms).

One associated problem is that existing components and methods of fast programming are passive (programming is done at power-up only) and require performing initial operations and further upgrades of configuration data at the factory. It would be desirable to find a way to re-program on-demand the FPGA and eventuality to redefine/reload configuration data, without any need of tool or any human intervention.

It would also be desirable to find a way to re-use a designed hardware platform for several applications (for example, all applications involving data manipulations like data parity computation, digital signatures of documents, cryptographic functions, . . . ), and to allow coexistence of those different applications on the same platform.

In addition, it would also be desirable to find a way to implement the heavy and complex functions hidden behind a targeted application into the smallest and slowest part possible. Isolating and partitioning supported functions into several independent smaller designs accessible and loadable at any time give the opportunity to downsize in a noticeable manner the size of the targeted FPGA.

For the foregoing reasons, there is a need for an improvement in the way that FPGAs are used in hardware platforms, for example, the one designed for redundant arrays of independent tapes (RAIT) application.

SUMMARY OF THE INVENTION

It is, therefore, an object of the present invention to provide a multiconfiguration module (MCM) utilizing an FPGA that is re-programmable on-demand and that is useable in a variety of hardware platforms such as, for example, RAIT.

In carrying out the above object, a multiconfiguration module (MCM) for use in a hardware platform for a host system, and hardware platform, are provided. The multiconfiguration module (MCM) comprises a field-programmable gate array (FPGA), a complex programmable logic device (CPLD), and a memory flash.

A first aspect of the invention is defining/designing hardware interfaces between the concerned components: the FPGA itself on one side, and the CPLD associated to the memory flash in charge of the FPGA programming on the other side.

A second aspect of the invention is a raw FPGA configuration data stream (representing a part of FPGA code which should be common to all streams), which handles via sets of dedicated registers all communications between a user application running on the host system and the hardware platform components.

The user application has the capability to first, load inside the memory flash one or more new configuration data streams (upgrades, new features, other applications, . . . ), and second, request a full or partial reconfiguration of the FPGA with any of the available configuration data streams. For example, a small Intel memory flash type RC28F320J3A (32 Mbits) allows storing up to 8 different configuration data streams for a one-million gates part.

The above object and other objects, features, and advantages of the present invention are readily apparent from the following detailed description of the best mode for carrying out the invention when taken in connection with the accompanying drawings.

BRIEF DESCRIPTION OF THE DRAWING

The sole FIGURE illustrates a preferred embodiment of a multiconfiguration module (MCM) including the miscellaneous interfaces and links involved.

DETAILED DESCRIPTION OF THE PREFERRED EMBODIMENT

A multiconfiguration module (MCM) is generally indicated at 10. Module 10 includes a field-programmable gate array (FPGA) 12, a complex programmable logic device (CPLD) 14, and a memory flash 16. The hardware interfaces between the components are indicated at 18. CPLD 14 is associated to memory flash 16 and is in charge of programming FPGA 12.

The hardware platform itself includes FPGA 12, CPLD 14, and memory flash 16, as well as other components specific to the particular hardware platform being implemented. The host system is represented by block 20. The drawing illustrates an exemplary embodiment showing specific components for FPGA 12, CPLD 14, and memory flash 16, however, it is to be appreciated that other embodiments of the invention may utilize different components.

The CPLD 14 could be considered as being the heart of the MCM 10. It has full control over the memory flash 16 and over the FPGA 12 dedicated configuration pins, so and so, it is able either at power-up or on-demand (Reboot or Reload command issued by user application running on the host system 20) to launch and control the programming operation of the FPGA 12 with any configuration data stream that it picks up from the memory flash 16.

Once the FPGA 12 is loaded, via a specific signal, it could claim to the CPLD 14 to grant it the control over the memory flash 16. This allows it to either store new data streams inside the memory flash 16 or read back previous ones already stored inside it.

The user application running on the host system 20 communicates with the CPLD 14 and/or the memory flash 16 across a host interface 22 (RAIT hardware platform uses PCI Local Bus standard, but any other standard could be used/supported) on one side and two specific interfaces 24, 26 on the other side. Those three interfaces 22, 24, 26 are the minimal elements of what could be considered as the raw FPGA configuration data stream. Any encapsulated application 28 (as RAIT is for example) should integrate them in order to keep the MCM functionality.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A multiconfiguration module (MCM) for use in a hardware platform for a host system, the module comprising:
    a field-programmable gate array (FPGA) programmed with a raw configuration data stream which handles communications between a user application running on the host system and the hardware platform;
    a memory flash operative to receive a new configuration data stream when dictated by the user application to allow the user application to request reconfiguration of the FPGA with the new configuration data stream; and
    a complex programmable logic device (CPLD) associated to the flash memory for programming the FPGA, the CPLD having control over the memory flash and FPGA to initiate programming of the FPGA with the new configuration data stream from the memory flash.

2. The multiconfiguration module of claim 1 wherein the memory flash allows storing of a plurality of different configuration data streams.

3. The multiconfiguration module of claim 1 wherein each configuration data stream includes a host interface, a memory flash interface, a CPLD control interface, a configuration interface.

4. The multiconfiguration module of claim 3 wherein at least one of the configuration data streams further includes an encapsulated application which integrates the included interfaces.

5. The multiconfiguration module of claim 4 wherein the encapsulated application is a redundant array of independent tapes (RAIT) application.

6. A hardware platform for a host system, the hardware platform comprising:
    a multiconfiguration module including a field-programmable gate array (FPGA), a memory flash, and a complex programmable logic device (CPLD), wherein the FPGA is programmed with a raw configuration data stream which handles communications between a user application running on the host system and the hardware platform, wherein the memory flash is operative to receive a new configuration data stream when dictated by the user application to allow the user application to request reconfiguration of the FPGA with the new configuration data stream, and wherein the CPLD is associated to the flash memory for programming the FPGA, the CPLD having control over the memory flash and FPGA to initiate programming of the FPGA with the new configuration data stream from the memory flash.

7. The hardware platform of claim 6 wherein the memory flash allows storing of a plurality of different configuration data streams.

8. The hardware platform of claim 6 wherein each configuration data stream includes a host interface, a memory flash interface, a CPLD control interface, a configuration interface.

9. The hardware platform of claim 8 wherein at least one of the configuration data streams further includes an encapsulated application which integrates the included interfaces.

10. The hardware platform of claim 9 wherein the encapsulated application is a redundant array of independent tapes (RAIT) application.

* * * * *